US006765162B2

(12) United States Patent
Wong et al.

(10) Patent No.: US 6,765,162 B2
(45) Date of Patent: Jul. 20, 2004

(54) MULTI-SEAL FLUID CONDUCTOR ELECTRICAL SWITCH DEVICE AND METHOD OF MANUFACTURE THEREFOR

(75) Inventors: Marvin G. Wong, Woodland Park, CO (US); You Kondoh, Yamato (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/687,121

(22) Filed: Oct. 15, 2003

(65) Prior Publication Data

US 2004/0079625 A1 Apr. 29, 2004

Related U.S. Application Data

(63) Continuation of application No. 10/173,383, filed on Jun. 14, 2002, now Pat. No. 6,720,507.

(51) Int. Cl.$^7$ .............................................. H01H 57/00
(52) U.S. Cl. ....................................................... 200/182
(58) Field of Search .......................... 200/182, 187–189, 200/209–219, 233–236; 310/328, 331, 348, 363; 335/4, 47, 78; 385/19

(56) References Cited

U.S. PATENT DOCUMENTS

| 3,955,059 | A | * | 5/1976 | Graf ............................ 200/181 |
| 5,471,185 | A | * | 11/1995 | Shea et al. ...................... 335/51 |
| 6,323,447 | B1 | * | 11/2001 | Kondoh et al. ............. 200/182 |
| 6,515,404 | B1 | * | 2/2003 | Wong ........................... 310/328 |

* cited by examiner

*Primary Examiner*—Michael A. Friedhofer (57) ABSTRACT

A switch device and a method of manufacture are provided that includes providing two substrates. The two substrates collectively include a fluid conductor switch device structure and a trench surrounding the fluid conductor switch device structure. An inner seal material is deposed on one of the substrates and an outer seal material is deposited in the trench. The substrates are joined to one another using the inner seal material and a peripheral hermetic seal is formed between the substrates using the outer seal material.

19 Claims, 5 Drawing Sheets

MULTI-SEAL FLUID CONDUCTOR ELECTRICAL SWITCH DEVICE AND METHOD OF MANUFACTURE THEREFOR

CROSS-REFERENCE TO RELATED APPLICATION(S)

This is a Continuation of application Ser. No. 10/173,383 filed on Jun. 14, 2002, now U.S. Pat. No. 6,720,507 the entire disclosure of which is incorporated herein by reference.

BACKGROUND

1. Technological Field

The present invention relates to an electrical switch device and more specifically to sealing a fluid conductor switch device.

2. Background Art

A reed relay is a typical example of a conventional small, mechanical contact type of electrical switch device. A reed relay has two reeds made of a magnetic alloy sealed in an inert gas inside a glass vessel surrounded by an electromagnetic driver coil. When current is not flowing in the coil, the tips of the reeds are biased to break contact and the device is switched off. When current is flowing in the coil, the tips of the reeds attract each other to make contact and the device is switched on.

The reed relay has problems related to large size and relatively short service life. As to the first problem, the reeds not only require a relatively large volume, but also do not perform well during high frequency switching due to their size and electromagnetic response. As to the second problem, the flexing of the reeds due to biasing and attraction causes mechanical fatigue, which can lead to breakage of the reeds after extended use.

In the past, the reeds were tipped with contacts composed of rhodium, tungsten, or were plated with rhodium or gold for conductivity and electrical arcing resistance when making and breaking contact between the reeds. However, these contacts would fail over time. This problem with the contacts has been improved with one type of reed relay called a "wet" relay. In a wet relay, a fluid conductor, such as mercury, is used to make the contact. This solves the problem of contact failure, but the problem of mechanical fatigue of the reeds remained unsolved.

In an effort to solve these problems, electrical switch devices have been proposed that make use of the fluid conductor in a channel between two switch electrodes. In the fluid conductor devices, the fluid conductor acts as the contacts connecting the two switch electrodes when the device is switched ON. The fluid conductor is separated between the two switch electrodes by a fluid non-conductor when the device is switched OFF. The fluid non-conductor fluid is generally high purity nitrogen or another such inert gas.

With regard to the size problem, the fluid conductor devices afford a reduction in the size of an electrical switch device since reeds are not required. Also, the use of the fluid conductor affords longer service life and higher reliability. However, the use of a gas fluid non-conductor presents sealing problems.

The fluid conductor devices are generally manufactured by joining together two substrates. For example, with past mercury switch devices, glass, silicon, or ceramic were used as the substrates and an adhesive agent or other resin used to join the substrates.

The substrate and the seal must both have low gas permeability, that is, good sealing properties. The sealing performance required of the fluid conductor switch devices can be grouped into two types: (1) short term sealing performance for intermittent conditions for suppressing leakage of gas due to sudden temperature-induced high internal gas pressures, and (2) long term sealing performance to prevent the slow exchange of the gas with the external atmosphere over an extended period of time.

The poor short-term sealing is linked to pronounced defects such as diminished switching efficiency or switch failure. The gas either will only partially separate the conductive fluid or fail to separate the conductive fluid entirely.

Short-term sealing problems usually do not occur under normal usage conditions, and there will be no short-term leakage of gas from the substrate itself unless the substrate is extremely porous or has pinholes, for example, with a diameter of several microns or more. Nor will there be any gas leakage over the short term from the adhesive or resin except in cases such as when the joint is imperfect or a gap remains at the joint interface.

Poor long-term sealing reduces long-term reliability. If the gas leaks through a seal and is replaced with air, oxygen and water vapor in the air will cause oxidation of conductive fluids or the electrodes. The oxidation can interfere with the contact between separated portions of the conductive fluid or can coat the electrodes to prevent proper contact of the electrodes with the conductive fluid.

Special packages (called "hermetic packages") are used in fields that demand particularly high reliability, such as the aerospace industry, military applications, and some industrial semiconductor devices. Hermetic packages are often specified for high reliability semiconductor devices where it is important to minimize the direct contact of the semiconductor devices with the external atmosphere and the resulting reactions linked to degradation such as oxidation. The military standard or MIL Spec is well known as a definition of a hermetic seal and is defined as leakage of less than $1 \times 10^{-8}$ atm·cc/sec of helium through the seal.

It is commonly known that a hermetic seal is difficult to achieve by joining substrates with an adhesive or a resin. As a result, maintaining reliability over the long term requires the mounting of the fluid conductor switch device itself inside a separate hermetic package, which often includes a separate substrate and a glass lid sintered into place on the separate substrate over the fluid conductor switch device.

The separate hermetic packaging itself is generally expensive, and special equipment is required for sintering the lid on to the separate substrate. This substantially increases the cost of the doubled hermetic packages. Also, a hermetic package must be of a certain minimum size in order to ensure proper sealing. This means the doubled hermetic packages have large overall sizes, which reduce the size advantage compared to reed switch devices.

One attempt at avoiding this size problem has been to install an extremely large number of fluid conductor switch devices in a single, large hermetic package. However, there is a limit to the number of fluid conductor switch devices that can be incorporated before the hermetic sealing is lost.

In addition, the short-term sealing becomes a problem because of the proximity of the fluid conductor switch devices, which result in gas leakage from one device to another.

Solutions to these problems have been long sought but have long eluded those skilled in the art.

SUMMARY OF THE INVENTION

The present invention provides a switch device and a method of manufacture that includes providing two substrates. The two substrates collectively include a fluid conductor switch device structure and a trench surrounding the fluid conductor switch device structure. An inner seal material is deposited on one of the substrates and an outer seal material is deposited in the trench. The substrates are joined to one another using the inner seal material and a peripheral hermetic seal is formed between the substrates using the outer seal material. This results in a simple and inexpensive packaging method for manufacturing a device having a compact and relatively simple structure, but also has high operating reliability and a long service life.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
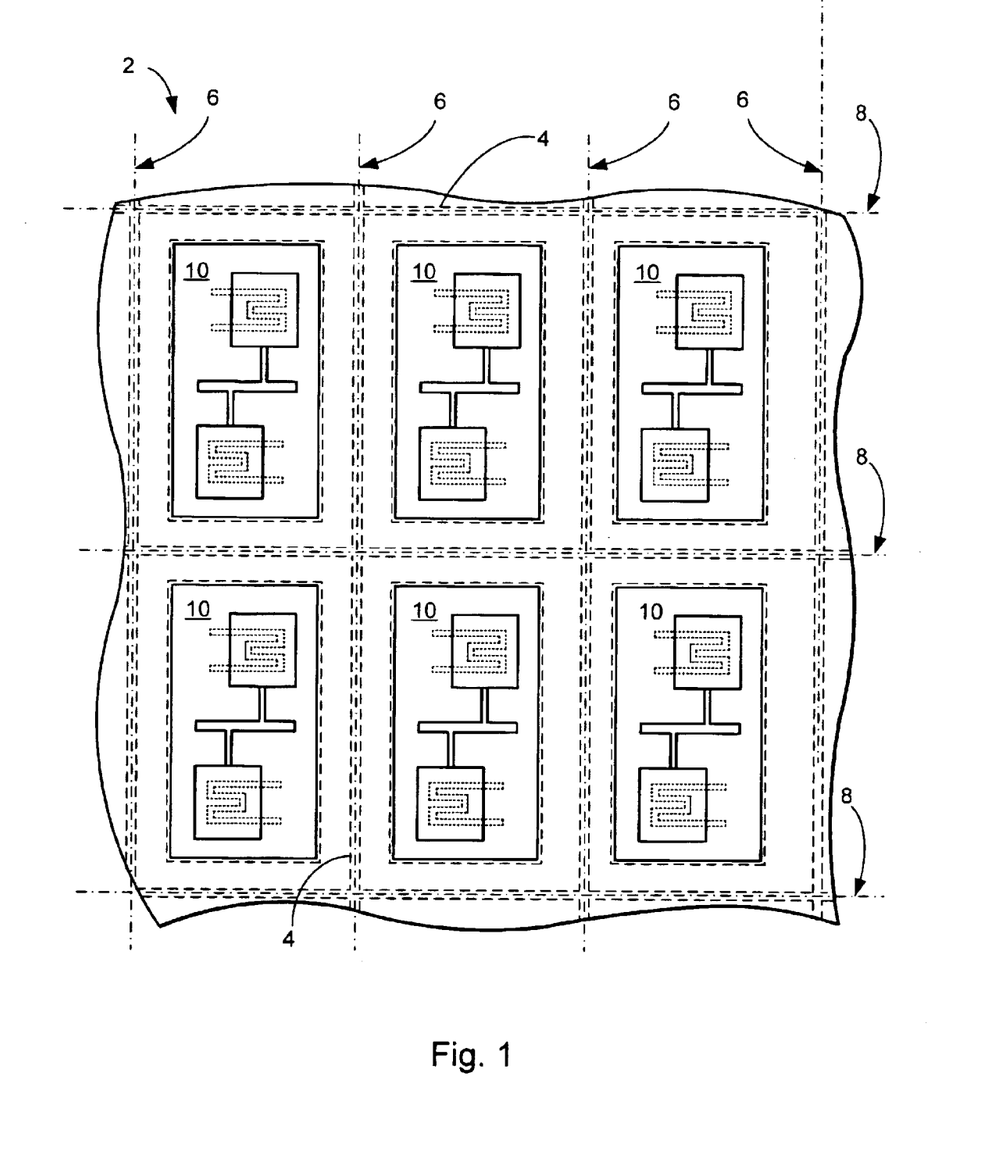
FIG. 1 is a simplified plan view of a plurality of multi-sealed fluid conductor switch devices before dicing into a plurality of single devices in accordance with the present invention.

Referring now to FIG. 1, therein is shown a simplified plan view of a plurality of fluid conductor electrical switch devices 2 before dicing into an individual fluid conductor electrical switch device 10 in accordance with the present invention. A single contiguous outer seal trench 4 encloses and isolates the contents of the devices 2. The dicing locations, or cut lines, are shown as future cutting lines 6 and 8 along the outer seal trench 4.

Figure 2:
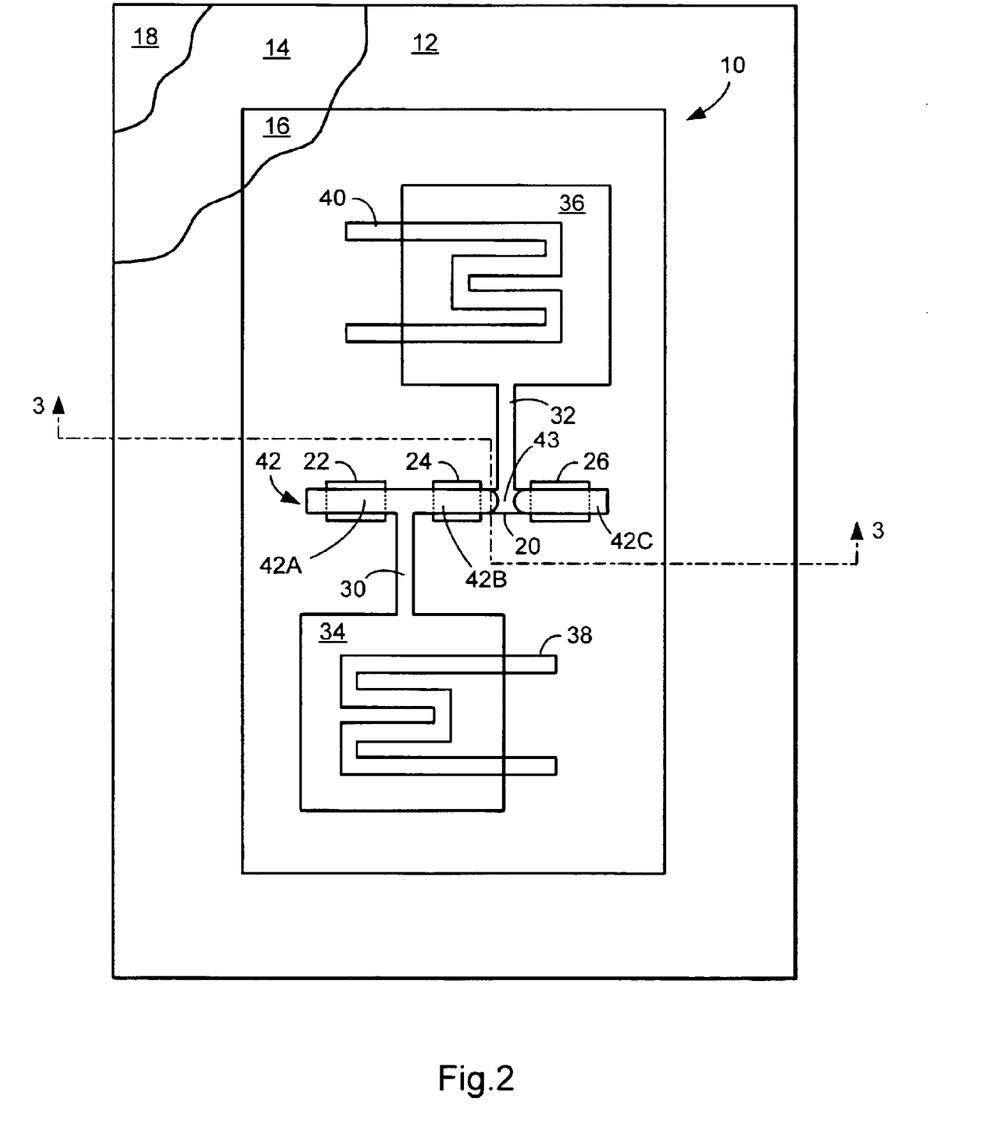
FIG. 2 is a plan view of a multi-sealed fluid conductor switch device in accordance with the present invention.

Referring now to FIG. 2, therein is shown a simplified plan view of the switch device 10 according to the present invention. The switch device 10 has a first substrate 12, an outer seal material 14, an inner seal material 16, and a second substrate 18. The first and second substrates 12 and 18 are of materials such as glass, ceramic, silicon, or a combination of such materials. The outer seal material 14 can be a number of different materials and an example would be a lead-tin solder, preferably of 80% lead and 20% tin by weight. The inner seal material 16 can be of a fluorocarbon compound such as one of the PTFE-based resins.

While different elements of the present invention can be on different substrates, the first substrate 12 is shown as including many of the elements by way of illustration. Thus, a main channel 20 is formed in the first substrate 12. Three electrodes 22, 24, and 26 are deposited in spaced relationship along the length of the main channel 20.

Sub-channels 30 and 32 are also formed in the first substrate 12 respectively connected to the main channel 20 between the electrodes 22 and 24 and between the electrodes 24 and 26. The sub-channels 30 and 32 respectively connect to chambers 34 and 36, which are formed in the first substrate 12. The chambers 34 and 36 respectively contain actuating elements 38 and 40.

The actuating elements 38 and 40 in one embodiment are resistive heating elements electrically powered through so-called "filled vias" (not shown) through the first substrate 12. The filled vias are perpendicular holes through the first substrate 12 that are filled with a conductor so there are no significant leaks through the holes.

The first substrate 12 has the main channel 20 filled with a fluid conductor 42, such as mercury, and a fluid non-conductor 43, such as argon or nitrogen. The second substrate 18 overlays the first substrate 12, and the fluid conductor 42 and the fluid non-conductor 43 are sealed in the main channel 20, the sub-channels 30 and 32, and the chambers 34 and 36 by the inner seal material 16 and the outer seal material 14. The fluid non-conductor 43 is capable of being expanded by the actuating elements 38 and 40 to cause divisions in the fluid conductor 42.

The materials of the first and second substrate 12 and 18 and of the inner seal material are selected to avoid chemical reaction with and wetting by the fluid conductor 42. Chemical reactions may render the fluid conductor 42 incapable of conducting current and wetting may make proper switching movement of the fluid conductor 42 impossible; i.e., an OFF state cannot be achieved because the electrical path between the electrodes 22, 24, and 26 cannot be interrupted.

In operation, the fluid conductor 42 can be divided into a first portion 42A, a middle portion 42B, and a second portion 42C, which are always respectively connected to the electrodes 22, 24, and 26. The sub-channels 30 and 32, the chambers 34 and 36, and portions of the main channel 20 are filled with the fluid non-conductor 43. The fluid non-conductor 43 is capable of separating the fluid conductor 42 into discrete portions, which will either connect the electrodes 22 and 24 or the electrodes 24 and 26 depending on whether the actuating element 38 or 40 is respectively actuated.

For example, the actuation of the actuating element 38 will expand the volume of the fluid non-conductor 43 in the chamber 34 to force the fluid non-conductor 43 through the sub-channel 30 to separate the fluid conductor 42 into two portions 42A and 42B at the intersection of the sub-channel 30 and the main channel 20 and force the portion 42B into joining with portion 42C. This results in electrical conduction (an ON state) between the electrodes 24 and 26 and in the interruption of the electrical path between the electrode 22, which is connected to the portion 42A, and the electrode 24 (OFF state). When the actuating element 40 is actuated, on the other hand, the operation is the reverse of that above, with the electrodes 22 and 24 being connected in an ON state, and the electrodes 24 and 26 being in an OFF state (not shown).

Figure 3:
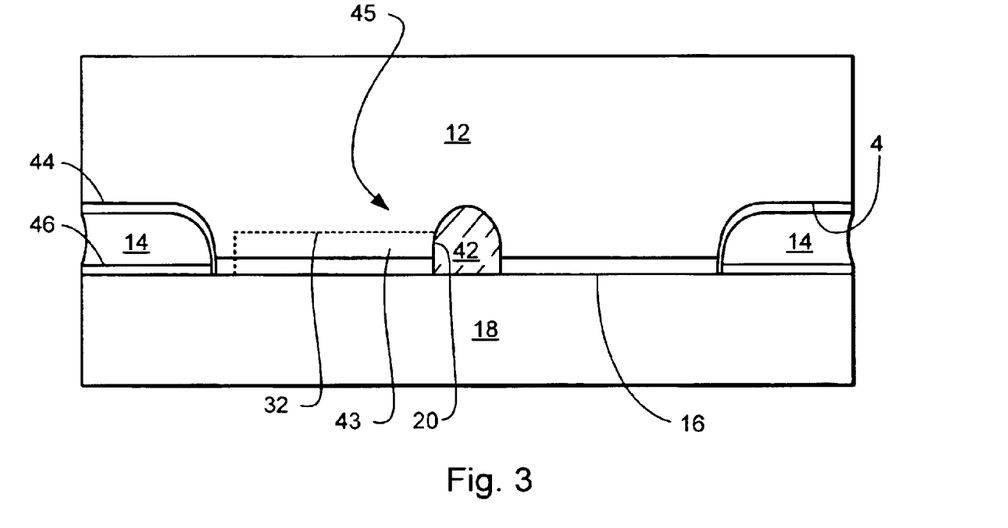
FIG. 3 is a cross-section of the device of FIG. 2 along line 3—3.

Referring now to FIG. 3, therein is shown a cross section along the line 3—3 of FIG. 2 of the switch device 10 in accordance with the present invention. The two substrates 12 and 18 collectively include a fluid conductor switch device structure 45 with the outer seal trench 4 surrounding the fluid conductor switch device structure 45. The fluid conductor switch device structure 45 includes the main channel 20, the electrodes 22, 24, and 26, the sub-channels 30 and 32, the chambers 32 and 34, and the actuating elements 38 and 40.

In the embodiment shown, the first and second substrates 12 and 18 are bonded by the inner seal material 16 and the outer seal material 14 in the outer seal trench 4. The main channel 20 in the first substrate 12 and the inner seal material 16 contain the fluid conductor 42. The sub-channel 32 in the first substrate 12 contains the fluid non-conductor 43.

The inner seal material 16 acts as a high-pressure seal when the actuating elements 38 and 40 provide intermittent high-pressure elevations or volumetric expansions of the fluid non-conductor 43 for the switching movement of the fluid conductor 42.

A high-pressure seal for the purposes of the present invention is defined as seals, which will not leak when the actuating elements 38 and 40 are activated to their highest levels. This may be accomplished in a number of ways including mechanically fixing the first and second substrates 12 and 18 in positions where the inner seal material 16 is constantly under compression, by providing adhesive containing forms of the inner seal material 16, or curing the inner seal material 16 in situ as an adhesive when it is a fluorocarbon resin.

A hermetic seal is formed by the outer seal material 14, which is provided at the boundary between the first and second substrates 12 and 18 along the edges of the substrates. The outside of the outer seal material 14 is exposed to the external atmosphere. First and second bonding films 44 and 46 are bonded respectively to the first substrate 12 and the second substrate 18 during deposition. The outer seal material 14 is then soldered to the first and second bonding films 44 and 46, thereby also serving to bond the first and second substrates 12 and 18.

Thus, a multi-sealed fluid conductor electrical switch device is provided for both short and long term operation. The first and second substrates 12 and 18 are of low permeability to the fluid non-conductor and the inner seal material 16 provides excellent short term sealing while the outer seal material 14 provides excellent long-term sealing. It will be understood that the inner seal material 16 also contributes to long-term sealing and the outer seal material 14 also contributes to short-term sealing.

Referring now to FIGS. 4A–4F, therein is shown in cross-section the steps in manufacturing the first substrate 12 for the plurality of devices 2 of FIG. 1 in accordance with the present invention. Again, for the structures not visible in the cross-section, reference should be made to FIG. 2.

Figure 4A:
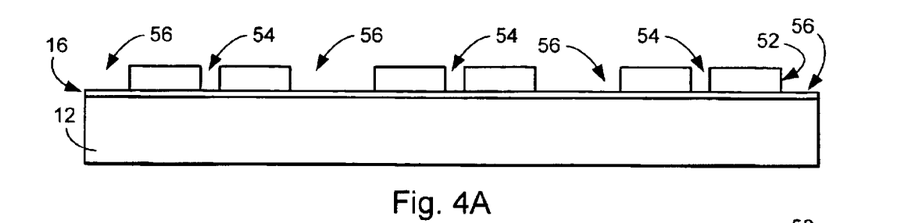
FIGS. 4A–4F show in cross-section the steps in manufacturing a top substrate for a plurality of multi-sealed fluid conductor switch devices in accordance with the present invention.

In FIG. 4A, the first substrate 12 is readied and coated with the inner seal material 16, after which a resist film 52 is deposited. The resist film 52 is patterned for forming the main channel 20, the sub-channels 30 and 32, the chambers 34 and 36, the opening for the electrodes 22, 24, and 26, and an outer seal trench 58 as shown in FIG. 2. In FIG. 4A, the cross-section corresponds to the cross-section of FIG. 3 so only a main channel resist opening 54 and an outer seal resist opening 56 are shown.

Figure 4B:
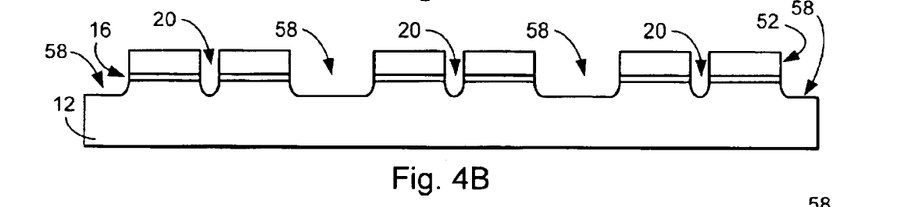

In FIG. 4B, the first substrate 12 and the inner seal material 16 are formed simultaneously by an etching process, such as sandblasting, to form the shapes in the first substrate 12 with the outer seal trench 58 encircling the other shapes in the first substrate 12 and the outer seal material 14. An advantage to using sandblasting is that the cross sectional shape of the main channel 20 and the outer seal trench 58 will be rounded, with no sharp corners to interfere with the smooth flow of the fluid conductor 42.

Figure 4C:
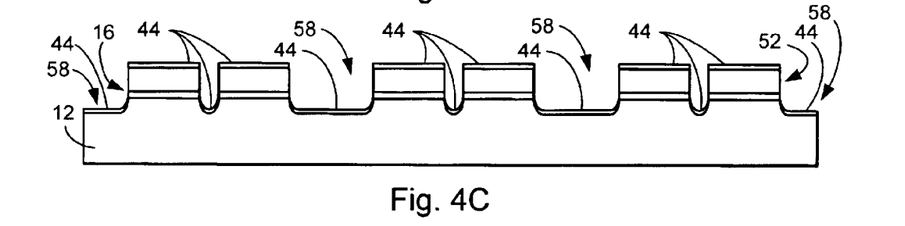

In FIG. 4C, the first bonding film 44 is deposited over the first substrate 12 and the resist film 52. The first bonding film 44 is of a material or materials to which solder material can be readily soldered. In one embodiment, a deposition process such as sputtering sequentially deposits a multi-layered first bonding film of metals such as chromium, copper, nickel, and gold.

Figure 4D:
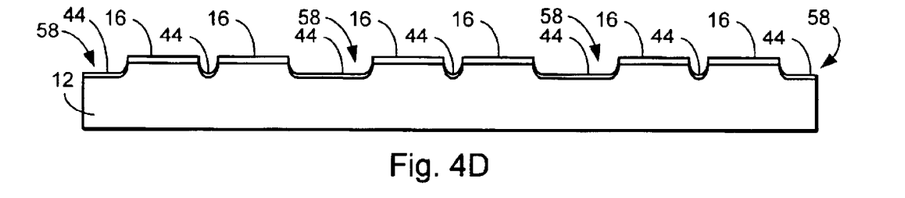

In FIG. 4D, the resist film 52 is removed, which can be accomplished by known techniques, leaving the first bonding film in the main channel 20, the sub-channels 30 and 32, the chambers 34 and 36.

Figure 4E:
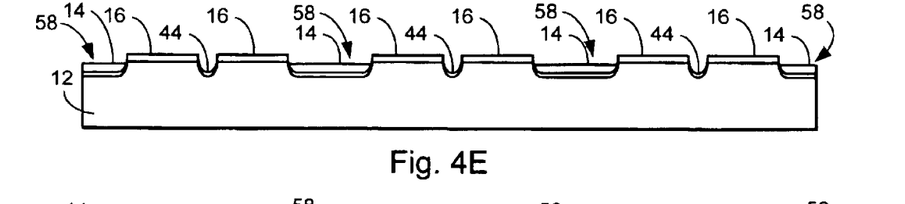

In FIG. 4E, the outer seal material 14 is selectively deposited on part of the first bonding film 44 located in the outer seal trench 58. It should be noted that the outer seal trench 58 is contiguous on the first substrate 12, which permits the disposition of the outer seal material 14 by a method such as electroplating in which the first bonding film 44 is used as an electrode. Where the outer seal material 14 is solder material, the solder material can be a brazing metal or alloy with a melting point of 450° C. The outer seal material 14 partially fills the outer seal trench 58.

By way of clarification, the outer seal trench 58 forms a grid opening over the surface of the first substrate 12 and the first bonding film 44, located in the outer seal trench 58, is separated from the first bonding film 44 elsewhere. This aspect can be understood by reference to FIG. 1. In FIG. 1, six individual devices 10 make up the plurality of devices 2.

When electroplating is performed, current is supplied from the edges of the first substrate 12 to the first bonding film 44 around the periphery of the six individual devices 10. No electroplating occurs in the unconnected regions. An advantage to this method is that it does not require a mask for the deposition process. However, care must be exercised in controlling the film thickness to minimize the etching away of the outer seal material 14 during subsequent wet or dry etching of the first bonding film 44 in the regions away from the outer seal trench 58.

Figure 4F:
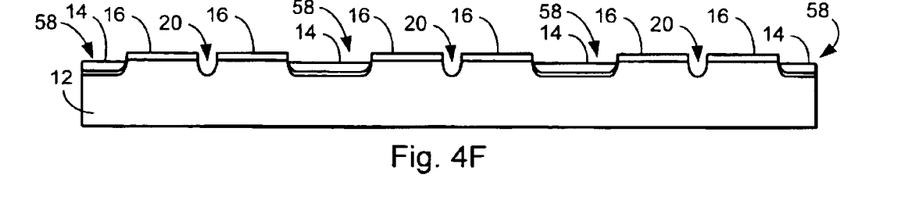

In FIG. 4F, the subsequent wet or dry etching of the first bonding film 44 has been performed. It will be understood that all or part of the first bonding film 44 located in regions away from the outer seal trench 58 are removed as required. If the first bonding film 44 is used for the electrodes 22, 24, and 26, the etching is performed so as to define the shape of the electrodes. The first bonding film 44 may be removed by etching prior to the disposition of the outer seal material 14, but in this case a mask will be necessary for etching.

Referring now to FIGS. 5A–5D, therein are shown cross-sections in the steps of assembling and dicing the plurality of devices 2 into devices 10 in accordance with the present invention.

Figure 5A:
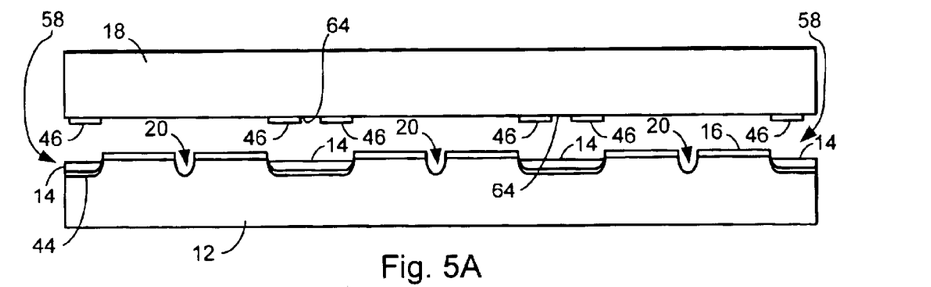
FIGS. 5A–5D show in cross-section the steps of assembling and dicing the plurality of multi-sealed fluid conductor switch devices in accordance with the present invention.

In FIG. 5A, the second substrate 18 is shown over the first substrate 12. The second bonding film 46 is pre-formed on the second substrate 18 in a location corresponding to the location of the outer seal trench 58. The second bonding film 46 of one switch device 10 is partially separated from the second bonding film 46 of another switch device by a gap 64.

In one embodiment, a deposition process such as screen printing sequentially deposits a multi-layered second bonding film 46 of metals such as chromium, copper, nickel, and gold.

In an alternative embodiment, portions of the second bonding film 46 can also be used for the electrodes 22, 24, and 26.

In further alternative embodiment, the electrodes 22, 24, and 26 of materials such as gold/platinum/chromium and gold/platinum/titanium are similarly deposited in a separate step.

Also deposited, but not shown, are the actuating elements 38 and 40, which may be deposited by screen printing.

Examples of materials for the actuating elements 38 and 40 when they are heaters include tantalum nitride, nichrome, and tantalum-aluminum.

Figure 5B:
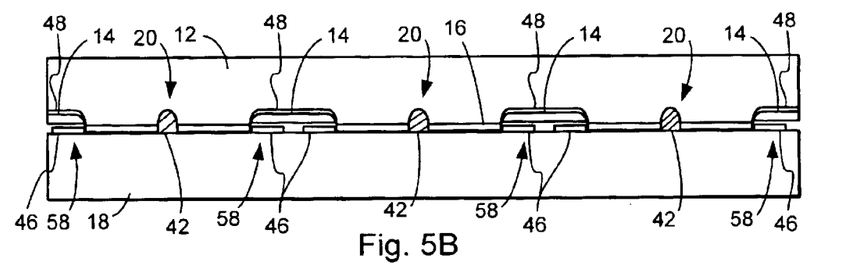

In FIG. 5B, the fluid conductor 42 has been placed in the main channel 20. The first and second substrates 12 and 18 are superposed and then heated and pressure-bonded using the inner seal material 16. The second bonding film 46 is disposed so as to overlap the outer seal trench 58, and the inner seal material 16 is bonded tightly to the substantially flat surface of the first substrate 12. The inner seal material 16 can be of a fluorocarbon resin, which exhibits thermoplasticity or flow and adhesion under temperature and pressure. This sealing process may be performed in an ambient of the fluid non-conductor 43 so as to fill and seal the sub-channels 30 and 32 and the chambers 34 and 36.

Figure 5C:
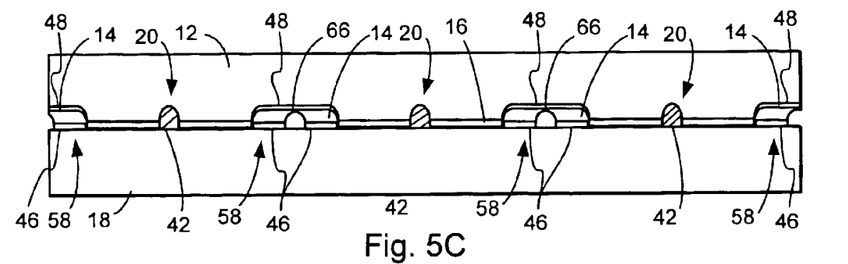

In FIG. 5C, where the outer seal material 14 is a solder material, the first and second substrates 12 and 18 are heated to over the solder reflow temperature, and the solder material melts so that it will wet the first and second bonding films 44 and 46 and join and seal the first and second substrates 12 and 18. As discussed above, the outer seal material 14 is disposed in the outer seal trench 58 such that there is a void, so the outer seal material 14 does not come into contact with the second bonding film 46 before melting. Once the outer seal material 14 melts, the outer seal material 14 begins to wet the side surfaces of the second substrate 18 where the second bonding film 46 has been formed joining the outer seal material 14 to the first bonding film 44. As a result, a small void 66 is formed over the gap 64. The small void 66 serves to prevent the sticking of solder material to a cutting blade or a deficiency of solder in the subsequent cutting or dicing step.

Figure 5D:
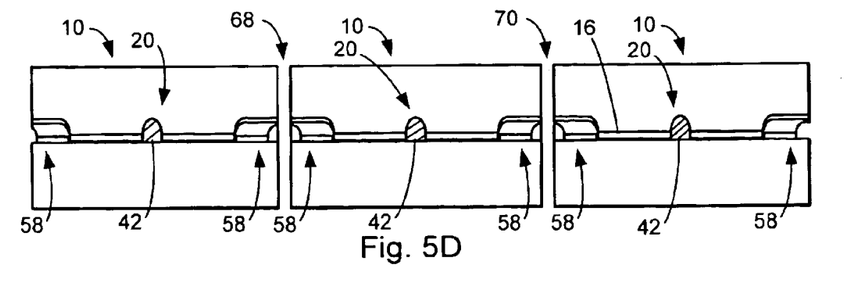

In FIG. 5D, the plurality of switch devices 10 is shown after dicing along cut lines 68 and 70 in the outer seal trench 58 in accordance with the present invention. With this method, hermetic packaging can be performed simultaneously with the assembly of the switch device 10, which leads to process simplification.

In a further embodiment, dicing can also be performed immediately after the step in FIG. 5B, after which reflow can be performed. Problems are encountered with this method, such as having to perform reflow for every switch device 10, or a high probability that the solder will be deficient during dicing. However, the thermal volume of a single switch device 10 that has to be heated is small, making it easier to control the temperature during reflow; the reflow time can be shortened. The advantage is that there is no step of mechanical working after reflow, so there is no danger that the good sealing state provided by the outer seal material 14 will be lost in a subsequent step, such as during dicing.

Figure 6:
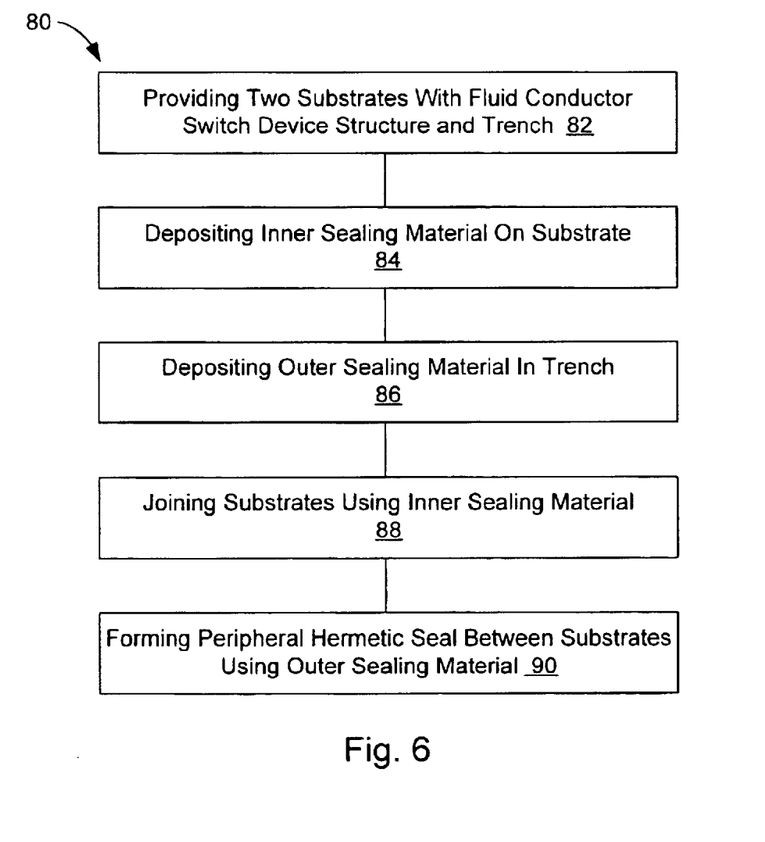
FIG. 6 shows a flow chart of the method in accordance with the present invention.

Referring now to FIG. 6, therein is shown a flow chart 80 of the method in accordance with the present invention. The method includes: providing two substrates collectively including a fluid conductor switch device structure and a trench surrounding the fluid conductor switch device structure 82; depositing an inner seal material on at least one of the substrates 84; depositing an outer seal material in the trench 86; joining the substrates to one another using the inner seal material 88; and forming a peripheral hermetic seal between the substrates using the outer seal material 90.

While the invention has been described in conjunction with specific embodiments, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth or shown in the accompanying drawings are to be interpreted in an illustrative and non-limiting sense.

What is claimed is:

1. A method for manufacturing a switch device, the method comprising:
   providing two substrates collectively including a fluid conductor switch device structure and a trench surrounding the fluid conductor switch device structure;
   depositing an inner seal material on one of the substrates;
   depositing an outer seal material in the trench;
   joining the substrates to one another using the inner seal material; and
   forming a peripheral hermetic seal between the substrates using the outer seal material.

2. The method of claim 1, in which:
   the trench is located in one of the substrates; and
   the method additionally comprises:
      depositing a first bonding film on the other of the substrates opposite the trench; and
      forming the peripheral hermetic seal includes wetting the first bonding film with the outer seal material.

3. The method of claim 2, in which wetting the first bonding film with the outer seal material includes melting the outer seal material to wet the first bonding film.

4. The method of claim 1, in which:
   the trench is located in one of the substrates; and
   the method additionally comprises:
      depositing a first bonding film in the trench, and depositing a second bonding film on the other of the substrates opposite the trench;
      depositing the outer seal material in the trench includes depositing the outer seal material on the first bonding film; and
      forming the peripheral hermetic seal includes melting the outer seal material to wet the first and second bonding film.

5. The method of claim 1, in which joining the substrates together includes applying pressure to the inner seal material.

6. The method of claim 5, in which joining the substrates together additionally includes applying heat to the inner seal material.

7. A method for manufacturing a switch device comprising:
   depositing an inner seal material on a first substrate;
   forming a channel through the inner seal material into the first substrate;
   forming a peripheral trench around and through the inner seal material into the first substrate;
   depositing an outer seal material in the peripheral trench;
   providing a second substrate;
   disposing a fluid conductor and a fluid non-conductor into the channel;
   forming electrodes to the channel;
   sealing the inner seal material to bond to the first and second substrates; and
   sealing the outer seal material to bond to the first and second substrates.

8. The method as claimed in claim 7, additionally comprising:
   depositing a first bonding film in the peripheral trench and bonded to the first substrate;

depositing the outer seal material in the peripheral opening on the first bonding film;

depositing a second bonding film on the second substrate around the periphery thereof;

placing the first and second substrates having the first and second bonding films oppositely positioned along the peripheries of the first and second substrates; and pressure and heat sealing the inner and outer seal materials.

9. The method as claimed in claim 7 wherein:

forming the channel forms a plurality of channels through the inner seal material into the first substrate;

forming the peripheral trench forms the peripheral trench around and isolating the plurality of channels;

disposing the fluid conductor includes disposing the fluid conductor into the plurality of channels;

disposing the fluid non-conductor includes disposing the fluid non-conductor into the plurality of channels;

forming the electrodes forms a plurality of electrodes to the channel; and dicing the first and second substrates along the peripheral opening to form a plurality of devices including the switch device.

10. The method as claimed in claim 7 wherein:

forming a chamber through the inner seal material into the first substrate, the chamber connected to the channel; and positioning an actuating element in the chamber.

11. A switch device, comprising:

a first substrate;

a second substrate opposite the first substrate, the second substrate and the first substrate collectively including:
a fluid conductor switch device structure, and
a trench surrounding the fluid conductor switch device structure;

inner seal material sandwiched between the first and second substrates; and outer seal material located in the trench and bonded to the first and second substrates.

12. The switch device of claim 11, in which:

one of the two substrates has the trench provided therein;

the switch device additionally comprises a first bonding film on the substrate having the trench provided therein and a second bonding film on the other of the substrates opposing the trench; and a peripheral hermetic seal includes the first bonding film bonded with the outer seal material.

13. The switch device of claim 11, in which:

one of the substrates has the trench provided therein;

the switch device additionally comprises:
a first bonding layer in the trench, and
a second bonding layer on the other of the substrates opposite the trench; and a peripheral hermetic seal includes the outer seal material bonded to the first and second bonding layers.

14. The switch device of claim 11, in which the two substrates are bonded together by the inner seal material.

15. A switch device comprising:

a first substrate having a channel and a peripheral trench provided therein, the channel encircled by the peripheral trench;

a second substrate opposite the first substrate;

an inner seal material on a first substrate bonded to and bonding the first and second substrates;

an outer seal material in the peripheral trench bonding the first and second substrates;

a fluid conductor in the channel;

a fluid non-conductor in the channel; and electrodes connected to the channel.

16. The switch device as claimed in claim 15 additionally comprises:

a first bonding film in the peripheral trench and bonded to the first substrate;

the outer seal material in the peripheral trench bonded to the first bonding film;

a second bonding film on the second substrate around a periphery thereof;

the first and second substrates having the first and second bonding films adjacently positioned along the peripheries of the first and second substrates; and the outer seal material bonded to the first and second bonding films.

17. The switch device as claimed in claim 15 wherein:

the inner seal material provides a high-pressure seal and a first hermetic seal; and the outer seal material provides a second hermetic seal.

18. The switch device as claimed in claim 15 wherein:

the first substrate has a chamber provided therein, the chamber connected to the channel;

an actuating element is in the chamber; and the inner and outer seal materials and the first and second substrates enclose the actuating element and the chamber.

19. The switch device as claimed in claim 15 wherein:

the first substrate has first and second chambers provided therein, the first and second chambers connected to the channel;

an actuating element is in the first and second chambers; and the inner and outer seal materials and the first and second substrates enclose the actuating element and the first and second chambers.

* * * * *